United States Patent
Hiscock et al.

(10) Patent No.: US 10,991,413 B2
(45) Date of Patent: Apr. 27, 2021

(54) MEMORY WITH PROGRAMMABLE DIE REFRESH STAGGER

(71) Applicant: Micron Technology, Inc., Boise, ID (US)

(72) Inventors: Dale H. Hiscock, Boise, ID (US); Michael Kaminski, Boise, ID (US); Joshua E. Alzheimer, Boise, ID (US); John H. Gentry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/502,680

(22) Filed: Jul. 3, 2019

(65) Prior Publication Data

US 2021/0005244 A1    Jan. 7, 2021

(51) Int. Cl.
*G11C 11/406*    (2006.01)
*G11C 11/4074*    (2006.01)
*G11C 11/4096*    (2006.01)

(52) U.S. Cl.
CPC ..... *G11C 11/40611* (2013.01); *G11C 11/4074* (2013.01); *G11C 11/4096* (2013.01)

(58) Field of Classification Search
CPC ... G11C 11/406; G11C 8/10; G11C 11/40611; G11C 11/4074; G11C 11/4096
USPC .................................. 365/222, 230.06, 194
See application file for complete search history.

(56) References Cited

U.S. PATENT DOCUMENTS

| | | | | |
|---|---|---|---|---|
| 4,601,018 A * | 7/1986 | Baum | .................. | G06F 12/0623 365/200 |
| 5,535,169 A * | 7/1996 | Endo | ..................... | G11C 11/406 365/189.04 |
| 10,504,577 B1 | 12/2019 | Alzheimer | | |
| 10,593,392 B1 * | 3/2020 | Johnson | ............ | G11C 11/40618 |
| 10,622,052 B2 * | 4/2020 | Vankayala | ............ | G06F 3/0659 |
| 2005/0111282 A1 * | 5/2005 | Dono | ................ | G11C 11/40611 365/222 |
| 2006/0069855 A1 * | 3/2006 | Ha | ......................... | G11C 11/406 711/106 |
| 2010/0182863 A1 * | 7/2010 | Fukiage | ............ | G11C 11/40618 365/222 |
| 2011/0320700 A1 * | 12/2011 | Bronson | ............. | G06F 12/0893 711/106 |
| 2012/0008434 A1 * | 1/2012 | Park | ...................... | G11C 11/406 365/194 |
| 2013/0272082 A1 * | 10/2013 | Kim | ...................... | G11C 11/402 365/203 |
| 2014/0160867 A1 | 6/2014 | Veches et al. | | |

(Continued)

*Primary Examiner* — Michael T Tran
(74) *Attorney, Agent, or Firm* — Perkins Coie LLP (57) ABSTRACT

Memory devices and systems with configurable die refresh stagger, and associated methods, are disclosed herein. In one embodiment, a memory system includes two or more memory dies. At least one memory die includes a fuse array storing refresh information that specifies a refresh group of the memory die. In these and other embodiments, at least one memory die includes a refresh group terminal and refresh group detect circuitry electrically connected to the refresh group terminal. The at least one memory die is configured to detect a refresh group of the memory die and to delay its refresh operation by a time delay corresponding to the refresh group. In this manner, refresh operations of the two or more memory dies can be staggered to reduce peak current demand of the memory system.

20 Claims, 6 Drawing Sheets

(56) References Cited

U.S. PATENT DOCUMENTS

| | | |
|---|---|---|
| 2015/0070056 A1 | 3/2015 | Tanadi |
| 2015/0179247 A1* | 6/2015 | Meinerzhagen ...... G11C 11/417 |
| | | 365/158 |
| 2015/0279443 A1* | 10/2015 | Park ................. G11C 11/40618 |
| | | 365/189.05 |
| 2015/0380073 A1* | 12/2015 | Joo ...................... G11C 11/406 |
| | | 365/189.05 |
| 2016/0078918 A1* | 3/2016 | Hyun ............... G11C 11/40611 |
| | | 365/222 |
| 2017/0068584 A1* | 3/2017 | Park ................. G11C 29/50016 |
| 2017/0069371 A1* | 3/2017 | Shin ................. G11C 11/40615 |
| 2017/0110178 A1* | 4/2017 | Bains ....................... G11C 8/12 |
| 2017/0148133 A1* | 5/2017 | Sumihiro .................. G06F 9/30 |
| 2018/0096719 A1* | 4/2018 | Tomishima .......... G11C 29/025 |
| 2018/0096735 A1 | 4/2018 | Pappu |
| 2018/0096979 A1 | 4/2018 | Pappu et al. |
| 2019/0130960 A1* | 5/2019 | Kim ................. G11C 11/40611 |
| 2019/0179698 A1* | 6/2019 | Liu ....................... G06F 3/0614 |
| 2020/0019458 A1* | 1/2020 | Cadloni ................ G06F 11/108 |
| 2020/0066328 A1* | 2/2020 | Fu ........................... G06F 13/16 |
| 2020/0075087 A1* | 3/2020 | Vankayala ............ G06F 3/0619 |
| 2020/0105318 A1 | 4/2020 | Mobin et al. |
| 2020/0168268 A1* | 5/2020 | Bessho ............. G11C 11/40618 |
| 2020/0194057 A1* | 6/2020 | Ishikawa ........... G11C 11/40611 |

\* cited by examiner

MEMORY WITH PROGRAMMABLE DIE REFRESH STAGGER

TECHNICAL FIELD

The present disclosure is related to memory systems, devices, and associated methods. In particular, the present disclosure is related to memory devices with programmable die refresh stagger, and associated systems and methods.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

As discussed in greater detail below, the technology disclosed herein relates to memory systems and devices (and associated methods) configured to refresh memory dies in refresh groups. More specifically, refresh operations of the refresh groups are staggered over time to reduce the peak current demand on the power supply during refresh operations of the memory system. A person skilled in the art, however, will understand that the technology may have additional embodiments and that the technology may be practiced without several of the details of the embodiments described below with reference to FIGS. 1-5. In the illustrated embodiments below, the memory systems and devices are primarily described in the context of devices incorporating DRAM storage media. Memory systems and devices configured in accordance with other embodiments of the present technology, however, can include other types of memory systems and devices incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM)) including one or more memory packages.

Refresh operations of a memory system (e.g., of one or more DIMM's, of one or more memory devices or packages, etc.) are current-intensive operations that present brief current demand peaks associated with individual refresh pumps. The current demand peaks are a result of simultaneously refreshing all memory die in a memory rank or system. In some memory systems and devices (e.g., in memory systems with three-dimensional stacking (3DS) of memory die), the current demand peaks during refresh operations can reach magnitudes that can cause problems. For example, during panic refresh operations, current demand peak can reach a magnitude that causes a memory system to suddenly reboot. The current demanded during refresh operations is exacerbated as memory systems and devices are configured to include a greater number of memory dies.

To address this concern, several embodiments of the present technology are directed to memory devices (e.g., volatile memory devices), systems including memory devices (e.g., DIMM's), and methods of operating memory devices in which the refresh operations of groups of memory dies across a memory system and/or device are staggered or offset over time to reduce the peak current demand of the memory system. In particular, individual memory devices (e.g., individual memory dies, individual memory packages having one or more memory dies, etc.) are assigned to one of a number of refresh groups associated with a specified time delay after the memory system initiates a refresh operation. In some embodiments, a fuse array of a memory device is programmed to assign the memory device to a refresh group. In these and other embodiments, at least one of the memory devices includes refresh group detect circuitry configured to determine the refresh group to which the memory device or a group of memory dies (e.g., a group of memory dies within a memory package) has been assigned. In turn, the memory devices can delay their refresh operations for a time corresponding to the refresh group to which they are assigned. In this manner, memory devices of a memory system can be refreshed in staggered groups, thereby spreading the current draw of a memory system over time and reducing the peak current demand of the memory system on the power supply.

Figure 1:
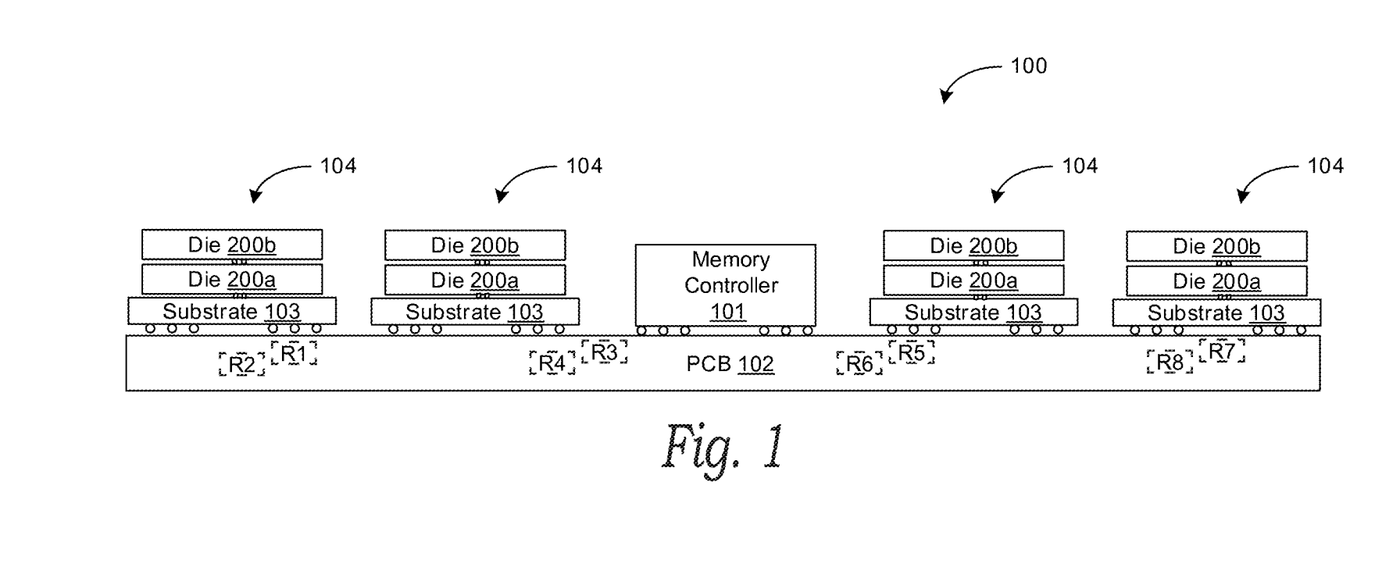
FIG. 1 is a block diagram schematically illustrating a memory system configured in accordance with various embodiments of the present technology.

FIG. 1 is a block diagram schematically illustrating a memory system 100 (e.g., a dual in-line memory module (DIMM)) configured in accordance with various embodiments of the present technology. The memory system 100 can include a memory controller 101 (e.g., a field programming gate array (FPGA) or other suitable memory controller) and one or more memory devices 104 (e.g., one or more dynamic random-access memory (DRAM) devices) electrically connected to the memory controller 101 via a printed circuit board (PCB) 102 (e.g., via one or more electrical contacts and/or traces). The memory controller 101 can be configured to control one or more operations of the memory system 100. For example, the memory controller 101 can control the refresh operations of the memory devices 104 of the memory system 100. In particular, the memory controller 101 can issue an auto-refresh command to direct one or more memory devices 104 of the memory system 100 to initiate their respective refresh operations.

Individual memory devices 104 of the memory system 100 can include a package substrate 103 and one or more memory dies 200. As illustrated in FIG. 1, each of the memory devices 104 includes a first memory die 200a attached to the package substrate 103, and a second memory die 200b stacked on top of the first memory die 200a. In some embodiments, the first and second memory dies 200a and 200b are each electrically connected to the package substrate 103 (e.g., via one or more electrical contacts and/or traces), which in turn can be electrically connected to the PCB 102. Although the devices 104 illustrated in FIG. 1 are dual die packages (DDP), one or more memory devices 104 configured in accordance with other embodiments of the present technology can include a greater or lesser number of memory dies 200 (e.g., one memory die or more than two memory dies) than illustrated. In these and other embodiments, the orientation of the memory dies included in a memory device 104 can vary. For example, the first and second memory dies 200a and 200b illustrated in FIG. 1 are each oriented face down (e.g., toward the package substrate 103) in a back-to-face orientation. In other embodiments, the first memory die 200a and/or the second memory die 200b can be oriented face up (e.g., away from the package substrate 103) such that the first and second memory dies 202a and 202b are arranged in a face-to-back, face-to-face, and/or back-to-back orientation on a package substrate 103. In these and still other embodiments, the first and second memory dies 200a and 200b can be arranged side-by-side on the package substrate 103, as opposed to the stacked arrangement illustrated in FIG. 1.

In some embodiments, the memory system 100 can further include one or more resistors. In the embodiment illustrated in FIG. 1, the memory system 100 includes eight resistors R1-R8. The resistors R1-R8 are illustrated within the PCB 102. In other embodiments, one or more of the resistors R1-R8 can be positioned at other locations within the memory system 100. For example, one or more of the resistors R1-R8 can be positioned within one or more of the package substrates 130, within one or more of the memory dies 200 (e.g., within the first and/or second memory dies 200a and/or 200b), within the memory controller 101, and/or within another component (not shown) of the memory system 100.

Each one of the resistors R1-R8 corresponds to a respective one of the memory devices 104 and/or memory dies 200 of the memory system 100. In particular, the resistors R1-R8 can each be electrically connected to a refresh group terminal (not shown) of a respective memory device 104 and/or memory die 200. The resistive values of a first subset of the resistors R1-R8 can differ from the resistive values of a second subset of the resistors R1-R8 such that different voltages can be delivered to the refresh group terminals across the memory system 100. In these and other embodiments, one or more of the resistors can be variable resistors such that their resistive values can be changed, which in turn can change the voltage supplied to the refresh group. As described in greater detail below, one or more of the memory dies 200 of the memory system 100 can include refresh group detect circuitry (not shown) to detect the voltages supplied to the refresh group terminals. In turn, the memory devices 104 and/or the memory dies 200 can determine a refresh group to which they are assigned and can delay executing their refresh operation for a time associated with the refresh group to which they are assigned.

Although the memory system 100 is illustrated with eight resistors R1-R8 in FIG. 1 where each one of the resistors R1-R8 corresponds to a respective memory device 104 and/or memory die 200 of the memory system 100, the number of resistors included in the memory system 100 of other embodiments can vary. For example, memory systems 100 configured in accordance with other embodiments of the present technology can include a greater or lesser number of resistors (e.g., more or less than eight resistors total) and/or can include a greater or lesser number of resistors per memory die 200 (e.g., zero or more than one resistor per memory die 200). In these and still other embodiments, the number of resistors per memory device 104 and/or memory die 200 can vary across the memory system 100.

The memory system 100 can be connected to any one of a number of electronic devices that is capable of utilizing memory for the temporary or persistent storage of information, or a component thereof. For example, the memory system 100 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory system 100, although, in other embodiments, the host device may be indirectly connected to the memory system 100 (e.g., over a networked connection or through intermediary devices).

Figure 2:
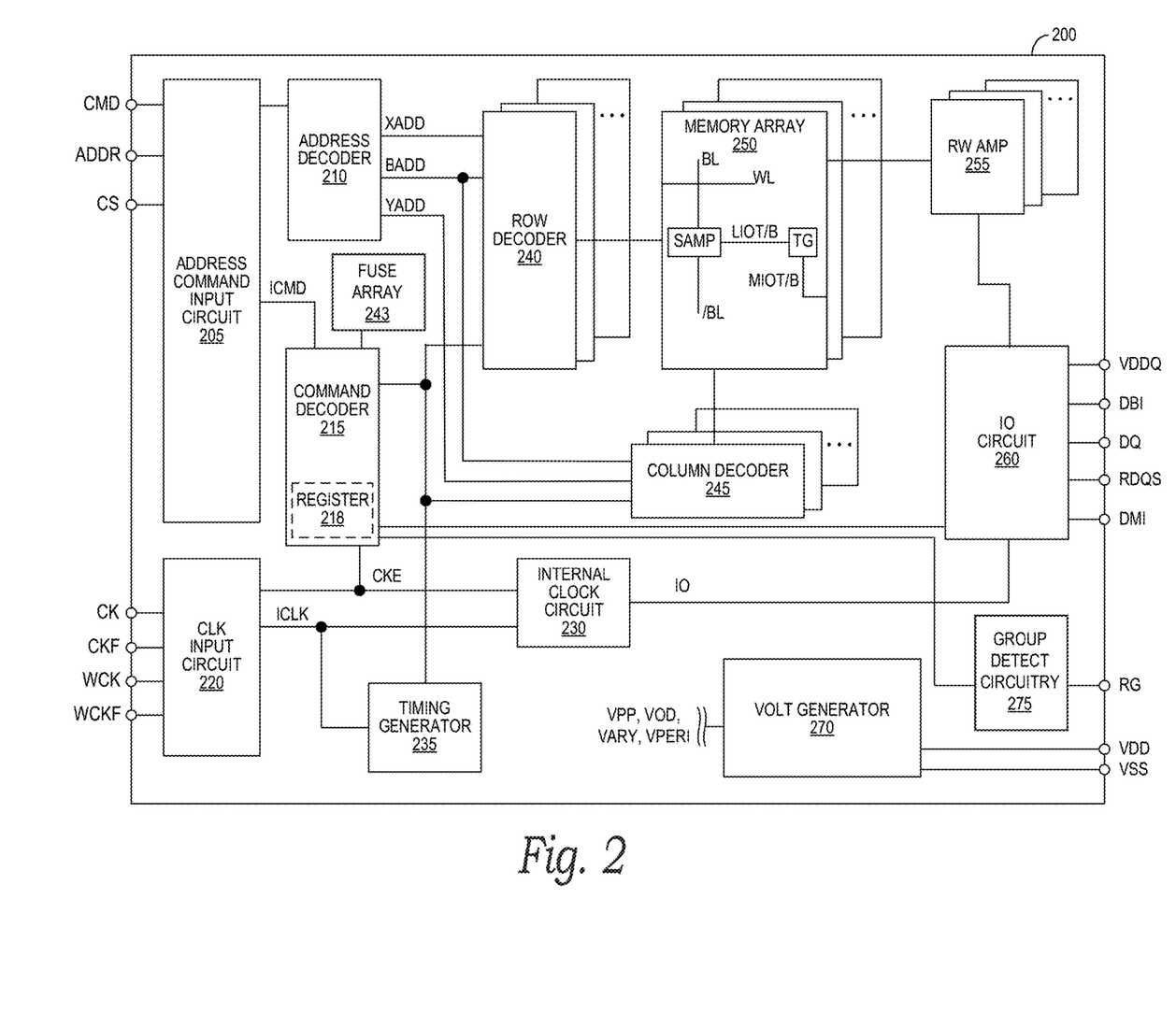
FIG. 2 is a block diagram schematically illustrating a memory device configured in accordance with various embodiments of the present technology.

FIG. 2 is a block diagram schematically illustrating a memory device 200 (e.g., a memory die 200, such as a first memory die 200a and/or a second memory die 200b of FIG. 1) configured in accordance with various embodiments of the present technology. The memory die 200 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, power supply terminals VDD, VSS, and VDDQ, and a refresh group terminal RG to receive a refresh group signal.

The power supply terminals of the memory die 200 may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in sense amplifiers included in the memory array 250 of the memory die 200, and the internal potential VPERI can be used in many other circuit blocks.

The power supply terminals may also be supplied with power supply potential VDDQ. The power supply potential VDDQ can be supplied to the IO circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 260 so that power supply noise generated by the IO circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a CKE signal from a command decoder 215, an input buffer can receive the CK and CKF signals and the WCK and WCKF signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable signal CKE from the command decoder 215. For example, the internal clock circuit 230 can include a clock path (not shown in FIG. 2) that receives the internal clock signal ICLK and provides various clock signals to the command decoder 215. The internal clock circuit 230 can further provide input/output (TO) clock signals. The IO clock signals can be supplied to an input/output (TO) circuit 260 and can be used as a timing signal for determining an output timing of read data and the input timing of write data. The IO clock signals can be provided at multiple clock frequencies so that data can be output from and input into the memory die 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated that can be used by the command decoder 215, the column decoder 245, and/or other components of the memory die 200.

The memory die 200 may include an array of memory cells, such as memory array 250. The memory cells of the memory array 250 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be a one or more memory banks or another arrangement of memory cells. In these and other embodiments, the memory regions of the memory array 250 can be arranged in one or more groups (e.g., groups of memory banks, one or more logical memory ranks or dies, etc.). Memory cells in the memory array 250 can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The command terminals and address terminals may be supplied with an address signal and a bank address signal from outside the memory die 200. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal (BADD) and supply the bank address signal to both the row decoder 240 and the column decoder 245.

The command and address terminals can be supplied with command signals CMD, address signals ADDR, and chip selection signals CS (e.g., from the memory controller 101 and/or a host device). The command signals may represent various memory commands (e.g., including access commands, which can include read commands and write commands). The select signal CS may be used to select the memory device 104 and/or the memory die 200 to respond to commands and addresses provided to the command and address terminals. When an active CS signal is provided to the memory die 200, the commands and addresses can be decoded and memory operations can be performed. The command signals CMD may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 215. The command decoder 215 may further include one or more registers 218 for tracking various counts or values.

When a read command is issued, and a row address and a column address are timely supplied with the read command, read data can be read from memory cells in the memory array 250 designated by the row address and the column address. The read command may be received by the command decoder 215, which can provide internal commands to the IO circuit 260 so that read data can be output from the data terminals DQ, RDQS, DBI, and DMI via read/write (RW) amplifiers 255 and the IO circuit 260 according to the RDQS clock signals. The read data may be provided at a time defined by read latency information RL that can be programmed in the memory die 200, for example in a mode register (not shown in FIG. 2). The read latency information RL can be defined in terms of clock cycles of the CK clock signal. For example, the read latency information RL can be a number of clock cycles of the CK signal after the read command is received by the memory die 200 when the associated read data is provided.

When a write command is issued, and a row address and a column address are timely supplied with the command, write data can be supplied to the data terminals DQ, DBI, and DMI over DQ lines connected to the memory die 200 according to the WCK and WCKF clock signals. The write command may be received by the command decoder 215, which can provide internal commands to the IO circuit 260 so that the write data can be received by data receivers in the IO circuit 260, and supplied via the IO circuit 260 and the RW amplifiers 255 to the memory array 250 over IO lines of the memory die 200. The write data may be written in the memory cell designated by the row address and the column address. The write data may be provided to the data terminals at a time that is defined by write latency WL information. The write latency WL information can be programmed in the memory die 200, for example, in the mode register (not shown in FIG. 2). The write latency WL information can be defined in terms of clock cycles of the CK clock signal. For example, the write latency information WL can be a number of clock cycles of the CK signal after the write command is received by the memory die 200 when the associated write data is received.

The memory array 250 may be refreshed or maintained to prevent data loss, either due to charge leakage or imprint effects. A refresh operation, may be initiated by the memory die 200, by the memory system 100 (e.g., by the memory controller 101 of FIG. 1), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory die 200 may be configured to refresh the same row of memory cells in every memory bank of the memory array 250 simultaneously. In another approach, the memory die 200 may be configured to refresh the same row of memory cells in every memory bank of the memory array 250 sequentially. In still another approach, the memory die 200 can further include circuitry (e.g., one or more registers, latches, embedded memories, counters, etc.) configured to track row (e.g., word line) addresses, each corresponding to one of the memory banks in the memory array 250. In this approach, the memory die 200 is not constrained to refresh the same row in each memory bank of the memory array 250 before refreshing another row in one of the memory banks.

Regardless of the refresh approach, the memory die 200 can be configured to refresh memory cells in the memory array 250 within a given refresh rate or time window (e.g., 32 ms, 28 ms, 25 ms, 23 ms, 21 ms, 18 ms, 16 ms, 8 ms, etc.), known as tREF. In these embodiments, the memory device 104 and/or the memory system 100 can be configured to supply refresh commands to the memory die 200 in accordance with a specified minimum cadence tREFI. For example, the memory device 104 and/or the memory system 100 can be configured to supply one or more refresh commands to the memory die 200 at least every 7.8 µs such that an approximate minimum of 4000 refresh commands are supplied to the memory die 200 within a 32 ms time window.

Figure 3A:
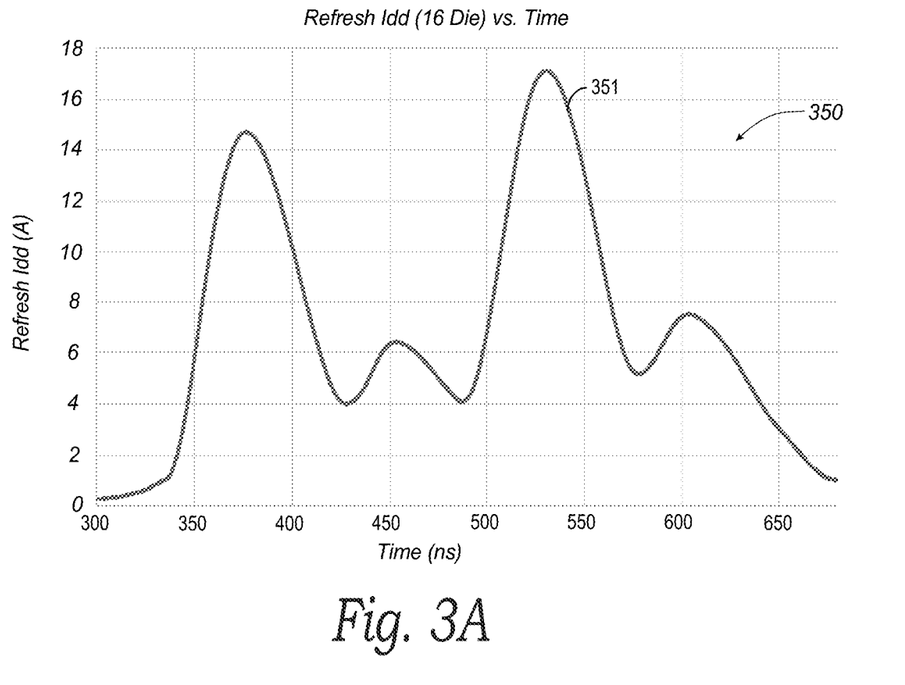
FIGS. 3A-3C are line plots illustrating current draw during refresh of a memory system configured in accordance with embodiments of the present technology.

As discussed above, refresh operations of a memory system and/or memory device (e.g., of the memory system 100 and/or of a memory device 104 illustrated in FIG. 1) are current-intensive operations that present brief current demand peaks associated with individual refresh pumps. FIG. 3A is a line plot 350 of a current demand curve 351 illustrating current demand of a memory system over time during execution of a refresh operation. As shown, the curve 351 includes two uneven current demand peaks that correspond to refresh pumps (activation of groups of word lines) during the refresh operation. The large, momentary magnitudes of these peaks are a result of refreshing all of the memory dies across the memory system at the same time. These peak demands of current can cause problems, such as sudden system reboots during panic-refresh operations.

To address this concern, memory systems and devices configured in accordance with various embodiments of the present technology assign individual memory devices (e.g., individual memory devices 104 and/or individual memory dies 200) to one of a number of refresh groups. When a refresh command is issued, the memory devices delay initiating their refresh operations by a time corresponding to the refresh group to which they are assigned. In this manner, the memory system can stagger or offset the refresh operations of groups of memory dies over time, which can distribute the current demanded by the memory system over time and reduce the peak current demand of the memory system on the power supply. As described in greater detail below, the delays corresponding to the refresh groups can be set such that the memory systems and devices adhere to a specified refresh rate or time window tRFC.

Referring again to FIG. 2, the memory die 200 (e.g., an individual memory die 200 and/or a memory device 104 having one or more memory dies 200) can include a fuse array 243 in which refresh information may be programmed and stored. The fuse array 243 can include antifuse elements. An antifuse element is an element which is insulated in an initial state and, when subjected to a dielectric breakdown by a connect operation, makes a transition to a conductive state. When the transition to the conductive state is made by the connect operation, the antifuse element cannot be returned to the insulated state. Therefore, the antifuse element can be used as a nonvolatile and irreversible storage element, and may be programmed using conventional antifuse programming circuits.

Using the fuse array 243, a memory die 200 of a memory system can be assigned to one of a number of refresh groups by programming refresh information into antifuse elements in the fuse array 243 that correspond to the memory die 200. During a refresh operation, a refresh logic and control circuit (not shown) of the command decoder 215 can read the refresh information from the fuse array 243 to determine a refresh group to which a memory die 200 has been assigned. In turn, the memory die 200 can delay its refresh operations by a time corresponding to the assigned refresh group.

Additionally, or alternatively, one or more memory dies 200 configured in accordance with several embodiments of the present technology can include refresh group detect circuitry 275. As shown, the group detect circuitry 275 can be electrically coupled to the refresh group terminal RG of the memory die 200 and/or of a memory device 104. In some embodiments, the refresh group terminal RG can be tied to a polarity (e.g., a polarity corresponding to "0" or "1") or can be left floating. In these and other embodiments, the voltage delivered to the refresh group terminal RG can be dependent on one or more resistors electrically connected to the refresh group terminal RG, such as one or more of the resistors R1-R8 illustrated in FIG. 1.

In some embodiments, the group detect circuitry 275 can include one or more buffers, comparators, analog-to-digital circuits, and/or other hardware components configured to determine whether the refresh group terminal RG is tied to a polarity, to determine to which polarity the refresh group terminal RG is tied, and/or to determine a voltage level supplied to the refresh group terminal RG. Based, at least in part, on one or more of these determinations, the group detect circuitry 275 can determine to which refresh group the memory die 200 is assigned, and the memory die 200 can delay its refresh operations by an amount of time corresponding to the assigned refresh group. In other words, the memory system 100 can assign memory dies 200 to a refresh group using the refresh group terminals RG of the memory dies 200.

In some embodiments, the values of the resistors are adjustable such that a memory die 200 can be reassigned to a different refresh group. In these and other embodiments, whether a refresh group terminal RG is tied to a polarity and/or the polarity to which the refresh group terminal RG of a memory die 200 is tied can be changed such that the memory die 200 can be reassigned to a different refresh group. In these and still other embodiments, the refresh groups associated with each of the resistor values, polarities, and/or floating refresh group terminals RG can be changed to reassign the memory dies 200 to different refresh groups.

Figure 3B:
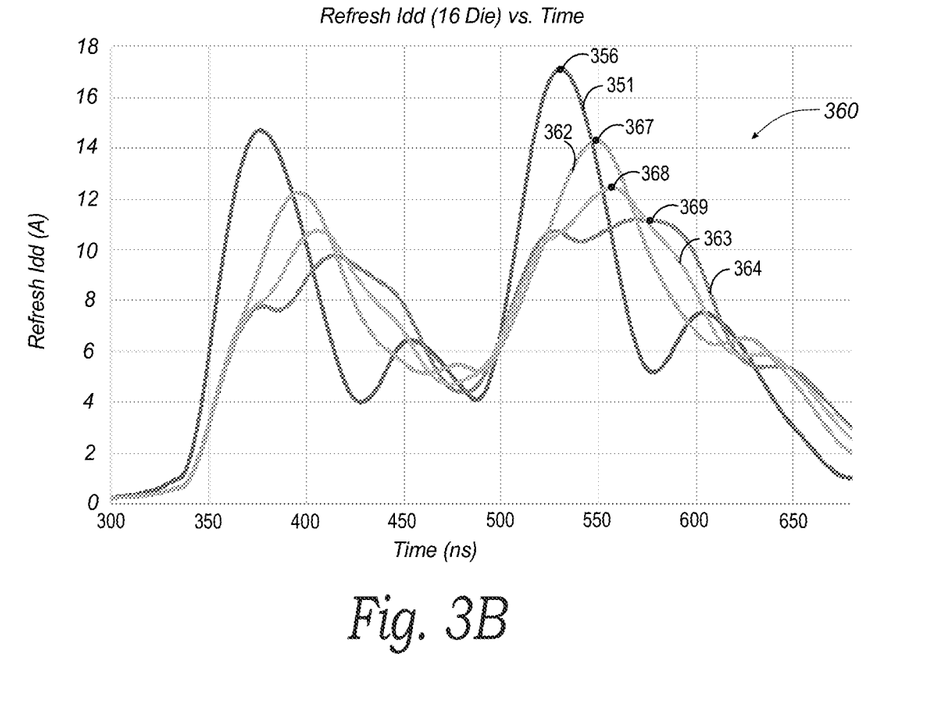

FIG. 3B is a line plot 360 of current demand curves 362-364 illustrating current demand of a memory system over time during execution of a refresh operation. In particular, the current demand curves 362-364 illustrate current demanded by the memory system when half of the memory dies of the memory system delay initiating their refresh operations by 30 ns, 40 ns, and 47 ns, respectively. The current demand curve 351 of FIG. 3A (illustrating the current demanded by the memory system when all of the memory dies of the memory system are refreshed simultaneously) is reproduced in the line plot 360 for ease of comparison.

As shown, each of the curves 362-364 includes two uneven current demand peaks that correspond to refresh pumps during the refresh operation and that are similar to the two uneven current demand peaks shown in the curve 351. The magnitudes of the demand peaks in the curves 362-364, however, are lesser than the magnitudes of the demand peaks in the curve 351. In particular, the curve 362 illustrates that delaying the refreshing operations of half of the memory dies of the memory system by 30 ns reduces the maximum current demanded by the memory system (shown at point 367 along the curve 362) by approximately 18% in comparison with the maximum current demanded by the memory system (shown at point 356 along the curve 351) when every memory die across the memory system is refreshed at the same time. The curves 363 and 364 illustrate that delaying the refresh operations of half of the memory dies of the memory system by 40 ns and 47 ns, respectively, reduces the maximum current demanded by the memory system (shown at point 368 along the curve 363 and at point 369 along the curve 364, respectively) by approximately 28% and 35%, respectively, in comparison with the maximum current demanded by the memory system (shown at point 356 along the curve 351) when every memory die across the memory system is refreshed at the same time. In other words, offsetting the momentary current draw of memory dies during refresh operations reduces the peak current demand of the memory system on the power supply.

Figure 3C:
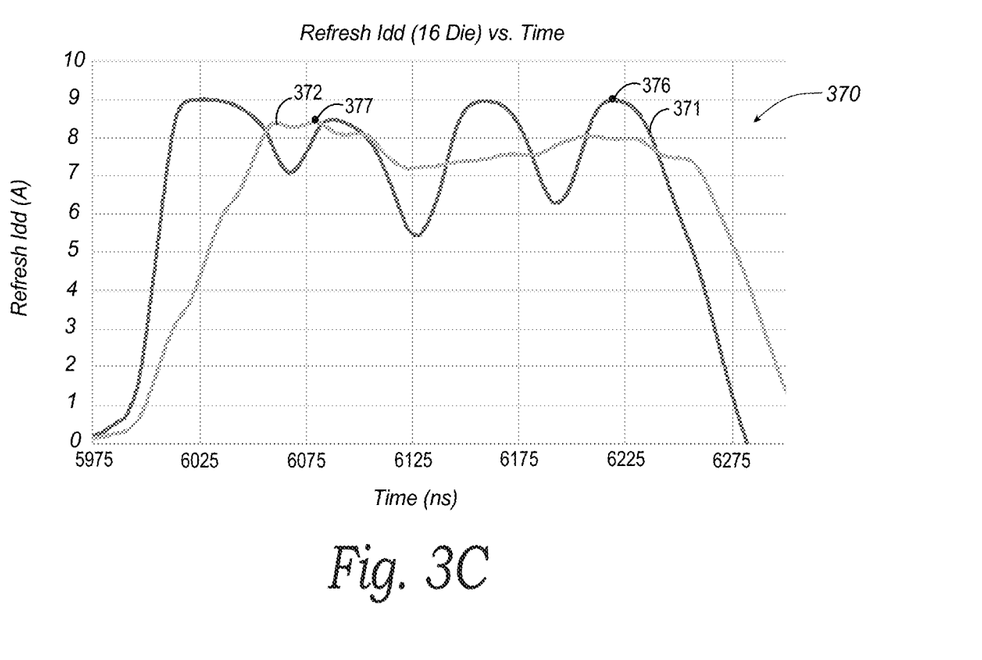

FIG. 3C is a line plot 370 of current demand curves 371 and 372 illustrating current demand of another memory system over time during execution of a refresh operation. In particular, the curve 371 illustrates the current demanded by the memory system when all of the memory dies of the memory system are refreshed simultaneously. In contrast, the curve 372 illustrates the current demanded by the memory system when a third of the memory dies of the memory system delay their refresh operations by 23 ns and a second third of the memory dies of the memory system delay their refresh operations by 46 ns. In other words, the memory dies of the memory system are divided into three refresh groups that are staggered and offset 23 ns from one another.

As shown in FIG. 3C, the curve 371 includes four current demand peaks that correspond to individual refresh pumps of the refresh operation. In contrast with the current demand peaks of the curve 351 illustrated in FIGS. 3A and 3B, the current demand peaks of the curve 371 are wider and are of roughly equal amplitude. As such, the reduction in the maximum current demanded is limited in comparison with the reduction of the maximum current demanded illustrated in FIG. 3B. Nevertheless, the maximum current demanded by the memory system (shown at point 377 along the curve 372) when offsetting the refresh operations of the three refresh groups by 23 ns from one another is reduced by approximately 7% in comparison with the maximum current demanded by the memory system (shown at point 376 along the curve 371) when every memory die in the memory system is refreshed at the same time.

As discussed in greater detail below, the number of refresh groups and the delays associated with each refresh group can be programmed to meet design needs and/or a refresh profile of a memory system. For example, the antifuse elements of the fuse array 243 can be programmed after the memory die and/or device is taped out so that real-world data can be used to optimize the delay solution. In these and other embodiments, memory dies can be assigned to a refresh group based on its tRFC characteristics. For example, memory dies with the most tRFC margin can be assigned to refresh groups associated with the largest delays so that the chance of inducing a tRFC fail by not meeting the refresh rate or time window tRFC specification outlined in a datasheet of the memory die and/or device is reduced. In these and other embodiments, staggering of refresh groups can be uniform or nonuniform.

In some embodiments, a memory system can assign refresh groups to individual memory dies 200 across the memory system (e.g., using refresh group detect circuitry 275 and/or refresh group terminals RG of one or more memory dies 200). In these and other embodiments, a memory system can assign memory dies 200 to one of a plurality of refresh groups by memory device 104. For example, one or more memory dies 200 of a memory device 104 can include refresh group detect circuitry 275 and a refresh group terminal RG. In these embodiments, the one or more memory dies 200 can be configured to detect refresh group(s) for the memory device 104 (e.g., refresh group detect circuitry 275 of an individual memory die 200 can detect a refresh group assigned to all or a subset of the memory dies 200 of the memory device 104). In other words, the memory system can assign individual memory devices 104 to a refresh group using the refresh group terminal RG and the refresh group detect circuitry of the memory devices 104 (e.g., of the one or more memory dies 200).

In these and other embodiments, a memory system 100 and/or a memory device 104 can be configured to assign individual memory dies 200 of the memory device 104 to one of a plurality of refresh groups. For example, at least one memory die 200 (e.g., a first memory die 200a) of the memory device 104 can include refresh group detect circuitry 275 configured to detect a refresh group signal delivered to a refresh group terminal RG of the at least one memory die 200. In these embodiments, the memory device 104 can assign the first memory die 200a to a first refresh group using the refresh group detect circuitry 275 and the power group terminal RG of the first memory die 200a and assign a second memory die 200b of the memory device 104 to a second refresh group (e.g., using refresh group detect circuitry 275 and/or a refresh group terminal RG of the second memory die 200b, or a lack thereof).

Additionally, or alternatively, a memory system and/or a memory device can assign individual memory dies to one of a plurality of refresh groups using other methods. For example, a memory device 104 can assign individual memory dies 200 to one of a plurality of refresh groups using static delays, control signals from other memory dies, and/or other metal options. As a specific example, a first memory die 200a of a memory device 104 can be assigned to a first refresh group and a second memory die 200b can be assigned to a second refresh group. As the memory device 104 initiates a refresh operation, the first memory die 200a can begin its refresh operations, and, sometime thereafter, the second memory die 200b can begin its refresh operations. The staggering of the refresh operations of the first memory die 200a and the second memory die 200b can be achieved via a control signal. The control signal can be static delay, or the control signal can be a signal sent from the first memory die 200a to the second memory die 200b following the first memory die 200a initiating its refresh operation. In some embodiments, the staggering between refresh operations of two or more memory dies 200 can be tailored specific to the refresh current profile of each memory device 104.

Figure 4A:
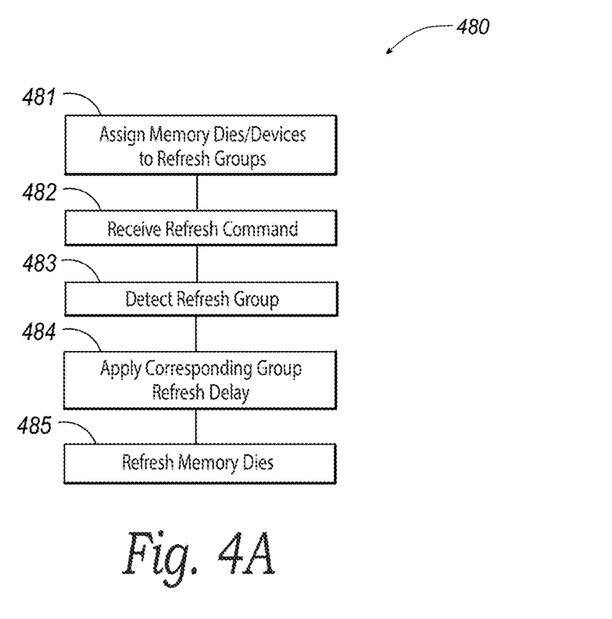
FIGS. 4A and 4B are flow diagrams illustrating routines of a memory system configured in accordance with various embodiments of the present technology.

FIG. 4A is a flow diagram illustrating a refresh routine 480 of a memory system configured in accordance with various embodiments of the present technology. In some embodiments, the routine 480 can be executed, at least in part, by various components of the memory system. For example, one or more steps of the routine 480 can be executed, at least in part, by a memory controller, a PCB, a memory device, a package substrate, and/or a memory die (e.g., by a fuse array, by refresh group detect circuitry, by a voltage generator, by a command decoder, etc. of the memory die). In these and other embodiments, one or more steps of the routine 480 can be executed, at least in part, by a host device operably connected to the memory system, by a manufacturer, by an end user, or by an intermediary party.

The routine 480 can begin at block 481 by assigning memory dies and/or devices of the memory system to one of at least two refresh groups. In some embodiments, the routine 480 can assign a memory die to a refresh group by programming refresh information into antifuse elements of a fuse array of the memory system. The refresh information can include an indication of the refresh group to which the memory die is assigned. In these and other embodiments, the routine 480 can assign a memory die to a refresh group by tying a refresh group terminal of the memory die to a polarity (e.g., a polarity corresponding to a first state "0" or a second state "1") or by leaving the refresh group terminal floating. In these and still other embodiments, a voltage supplied to a refresh group terminal of a memory device can be used to assign the memory die to a refresh group. For example, a voltage supplied to a refresh group terminal of a first memory die can differ from a voltage supplied to a refresh group terminal of a second memory die, thereby assigning the first memory die to a different refresh group than the second memory die. In some embodiments, different voltages can be supplied to the refresh group terminals of different memory dies by electrically connecting resistors of differing values to the refresh group terminals (e.g., external to the memory dies).

In some embodiments, a memory die can be assigned to a refresh group at the time of manufacture or assembly. In these and other embodiments, a memory die can be assigned to a refresh group after the memory system, a memory device of the memory system, and/or a memory die of the memory device have been taped out. For example, a memory system can be fully or partially assembled, and the routine 480 can analyze the refresh profile of the memory system (e.g., of the memory system as a whole, of a memory device of the memory system, and/or of a memory die of a memory device). Based at least in part on the refresh profile, the routine 480 can determine the number of refresh groups and the delays associated with each refresh group to alter (e.g., change, customize, optimize, etc.) the refresh profile such that the peak current demanded by the memory system during a refresh operation is reduced and/or below a threshold. As part of this determination, the routine 480 can ensure that the number of refresh groups and the delays associated with each group permit each of the memory dies to be refreshed within a time allotted for the refresh operation, known as tRFC. Additionally, or alternatively, the routine 480 can analyze the tRFC characteristics of one or more memory dies of the memory system to determine to which refresh group the memory dies should be assigned. For example, the routine 480 can assign memory dies having the most tRFC margin to refresh groups associated with the largest delays, thereby reducing the chance of inducing a tRFC fail.

At block 482, the routine 480 can receive a refresh command. In some embodiments, the refresh command can be issued by a memory controller of a memory system. In these and other embodiments, the refresh command can be issued by one or more components of a memory device and/or memory die.

At block 483, the routine 480 can detect a refresh group to which a memory die is assigned. In some embodiments, the routine 480 can detect a refresh group in response to receiving the refresh command at block 482. In these and other embodiments, the routine 480 can detect a refresh group of a memory die by reading refresh information of the memory die from corresponding antifuse elements in the fuse array (e.g., using a command decoder or another component of the memory die). In these and other embodiments, the routine 480 can detect a refresh group using refresh group detect circuitry of the memory die. For example, in embodiments where a memory die is assigned to a refresh group by tying a refresh group terminal of the memory die to a polarity or by leaving the refresh group terminal floating, the routine 480 can detect to which refresh group the memory die is assigned by using the group detect circuitry (a) to determine whether the refresh group terminal of the memory die is tied to a polarity and/or (b) to determine to which polarity the refresh group terminal is tied. For example, the routine 480 can attempt to drive the refresh group terminal of the memory die high (e.g., to a polarity corresponding to a second state "1") and/or can attempt to drive the refresh group terminal of the memory die low (e.g., to a polarity corresponding to a first state "0"). If the routine 480 determines that a large amount of current is required to drive the refresh group terminal in one direction (e.g., relative to the current required to drive the refresh group terminal in the other direction), the routine 480 can determine that the refresh group terminal is (a) tied to a polarity and/or (b) tied to a polarity opposite the direction that required the greatest amount of current. On the other hand, if the routine 480 is able to drive the refresh group terminal high and low with a relatively small amount of current, the routine 480 can determine that the refresh group terminal of the memory die is floating.

Based on the determination of whether the refresh group terminal of a memory die is tied to a polarity and/or on the determination of which polarity the refresh group terminal is tied, the routine 480 can determine to which refresh group the memory die is assigned. In some embodiments, for example, the routine 480 can determine (i) that the memory die is assigned to a first refresh group when the refresh group terminal of the memory die is tied to either polarity, and (ii) that the memory die is assigned to a second refresh group when the refresh group terminal is floating. In other embodiments, the routine 480 can determine (i) that the memory die is assigned to a first refresh group when the refresh group terminal is tied to a first polarity, (ii) that the memory die is assigned to a second refresh group when the refresh group terminal is tied to a second polarity, and (iii) that the memory die is assigned to a third refresh group when the refresh group terminal is floating.

In embodiments where the voltage supplied to the refresh group terminal of the memory die assigns the memory die to a refresh group, the routine 480 can determine the value of the resistor(s) (if any) electrically connected to a refresh group terminal of a memory die using refresh group detect circuitry of the memory die. Based on the determined value of the resistor(s) (e.g., based on the voltage supplied to the refresh group terminal of a memory die), the routine 480 can determine a refresh group to which the memory die is assigned.

In some embodiments, an assignment of a memory die to a refresh group can remain unchanged for the life of the memory system (or of one of its components). In these and other embodiments, the routine 480 can be configured (i) to detect to which refresh group a memory die has been assigned the first time the memory die is powered on and/or the first time a refresh command is issued and (ii) to store this information for use in future refresh operations of the memory die. In these and still other embodiments, the refresh group assignments can be changed (e.g., by varying the resistance values electrically connected to the refresh group terminals of the memory dies, by changing the polarity to which the refresh group terminals are tied, by changing the associations of refresh groups with voltage values and/or polarities, etc.). In these and other embodiments, the routine 480 can be configured to detect a refresh group assignment of the memory die each time the memory die is powered on, each time a refresh command is issued, after a certain amount of time has elapsed, and/or after a certain number of events (e.g., refresh operations) have occurred.

At block 484, the routine 480 can delay refresh operations of a memory die by a time corresponding to a refresh group to which the memory die is assigned (e.g., determined at block 483). In some embodiments, the routine 480 can delay refresh operations of a memory die by delaying an internal auto-refresh AREF command path of the memory die. For example, the routine 480 can delay an internal auto-refresh AREF command path of the memory die by routing a refresh command signal through a series of clocked latches in a manner similar to how read or write latency is implemented into the memory die. In these and other embodiments, the duration of a delay corresponding to a refresh group can be measured from (a) the time a refresh command is issued by the memory controller (or another component of the memory system), and/or (b) the time memory dies of another refresh group initiate and/or finish executing their refresh operations.

At block 485, the routine 480 can initiate the refresh operations of the memory dies assigned to a refresh group. For example, the routine 480 can initiate the refresh operations of the memory dies after an amount of time corresponding to the delay determined at block 484 has elapsed.

Figure 4B:
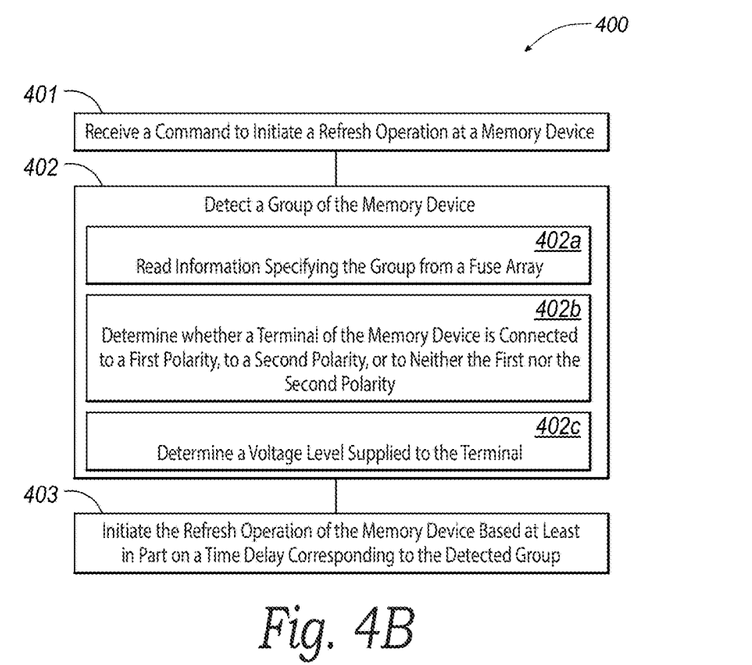

FIG. 4B is a flow diagram illustrating a routine 400 of a memory system configured in accordance with various embodiments of the present technology. In some embodiments, the routine 400 can be executed, at least in part, by various components of the memory system. For example, one or more steps of the routine 400 can be executed, at least in part, by a memory controller, a PCB, a memory device, a package substrate, and/or a memory die (e.g., by circuitry, by a voltage generator, by a command decoder, etc. of the memory die). In these and other embodiments, one or more steps of the routine 400 can be executed, at least in part, by a host device operably connected to the memory system, by a manufacturer, by an end user, or by an intermediary party.

The routine 400 begins at block 401 by receiving a command to initiate a refresh operation at a memory device. The memory device can be a memory device of a plurality of memory devices of a memory system. In some embodiments, the memory device is a single memory die. In other embodiments, the memory device includes two or more memory dies, such as a first memory die and a second memory die. In some embodiments, memory dies of the memory device share terminals and/or circuitry associated with a refresh operation of the memory dies and/or of the memory device. In other embodiments, a memory die of the memory device can have its own dedicated terminal(s) and/or circuitry associated with a refresh operation of the memory die and/or of the memory device. In some embodiments, the command can be an external voltage received at the memory device and/or at the memory system. For example, the command can be a voltage applied to a terminal of the memory device. As another example, the command can be a command issued by a memory controller of the memory system.

At block 402, the routine 400 detects a group of the memory device. In some embodiments, each of a plurality of memory devices belong to one of a plurality of groups, where each group is associated with a different time delay for initiating a refresh operation for memory devices of the group.

In some embodiments, detecting the group of the memory device includes reading information from a fuse array (block 402a). The fuse array has antifuse elements corresponding to the memory device. In some embodiments, the memory device includes the fuse array. For example, an individual memory die can include the fuse array. As another example, the fuse array can be spread amongst multiple memory die of the memory device. In other embodiments, the fuse array can be located outside of the memory device. In some embodiments, the information stored in the fuse array specifies the group of the memory device.

Additionally, or alternatively, detecting the group of the memory device includes determining whether a terminal of the memory device is connected to a first polarity, a second polarity, or to neither the first nor the second polarity (block 402b). The terminal can be associated with the refresh operation of the memory device. In some embodiments, the routine 400 makes this determination by driving the terminal of the memory device high, by driving the terminal of the memory device low, or both.

In some embodiments, the routine 400 determines that the group of the memory device is a first group when the terminal is connected to either the first polarity or the second polarity. In these and other embodiments, the routine 400 determines that the group of the memory device is a second group when the terminal is not connected to either the first polarity or the second polarity. In other embodiments, the routine 400 determines that the group of the memory device is a first group when the terminal is connected to the first polarity, that the group of the memory device is a second group when the terminal is connected to the second polarity, and/or that the group of the memory device is a third group when the terminal is not connected to either the first polarity or the second polarity.

Additionally, or alternatively, detecting the group of the memory device includes determining a voltage level supplied to at least one terminal of the memory device (block 402c). The at least one terminal can be associated with the refresh operation of the memory device. In some embodiments, the at least one terminal of the memory device includes the terminal of the memory device discussed above with respect to block 402b. In these and other embodiments, the at least one terminal of the memory device includes one or more terminals of the memory device different than the terminal of the memory device discussed above with respect to block 402b. In some embodiments, at least one resistor is electrically connected to the at least one terminal of the memory device and is configured to affect a voltage level supplied to the at least one terminal of the memory device.

In some embodiments, the routine 400 makes the determination at block 402a, the determination at block 402b, and/or the determination at block 402c using circuitry of the memory device. The circuitry can be electrically connected to one or more terminals of the memory device. In some embodiments, the circuitry includes a comparator, an analog-to-digital converter, or both.

In embodiments where the memory device includes two or more memory dies, the routine 400 can detect a group of all or a subset of the memory dies. For example, to detect the group of the memory device, the routine 400 can detect a first group of a first memory die of the memory device and detect a second group of a second memory die of the memory device.

At block 403, the routine 400 initiates the refresh operation of the memory device based at least in part on a time delay corresponding to the detected group(s) of the memory device. In embodiments where the memory device includes two or more memory dies, the routine 400 can initiate a first refresh operation of a first memory die in a first group based at least in part on a first time delay corresponding to the first group, and can initiate a second refresh operation of the second memory die in a second group based at least in part on a second time delay corresponding to the detected second group. In some embodiments, the first time delay and the second time delay are the same. In other embodiments, the first time delay and the second time delay are different. In some embodiments, the time delay corresponding to the first group and/or the second group is greater than zero seconds (0 s). In these and other embodiments, the time delays corresponding to groups of memory dies and/or devices stagger initialization of a refresh operation of each group by a uniform or nonuniform amount of time. Although the steps of the routine 480 and the routine 400 are discussed and illustrated in a particular order, the methods illustrated by the routine 480 and the routine 400 in FIG. 4A and FIG. 4B, respectively, are not so limited. In other embodiments, the methods can be performed in a different order. For example, any of the steps of the routine 480 and/or of the routine 400 can be performed before, during, and/or after any of the other steps of the routine 480 and/or of the routine 400. Moreover, a person of ordinary skill in the relevant art will readily recognize that the illustrated methods can be altered and still remain within these and other embodiments of the present technology. For example, one or more steps of the routine 480 illustrated in FIG. 4A and/or of the routine 400 illustrated in FIG. 4B can be omitted and/or repeated in some embodiments. In some embodiments, all or a subset of some or all of the steps of the routine 480 and/or of the routine 400 can be combined.

Figure 5:
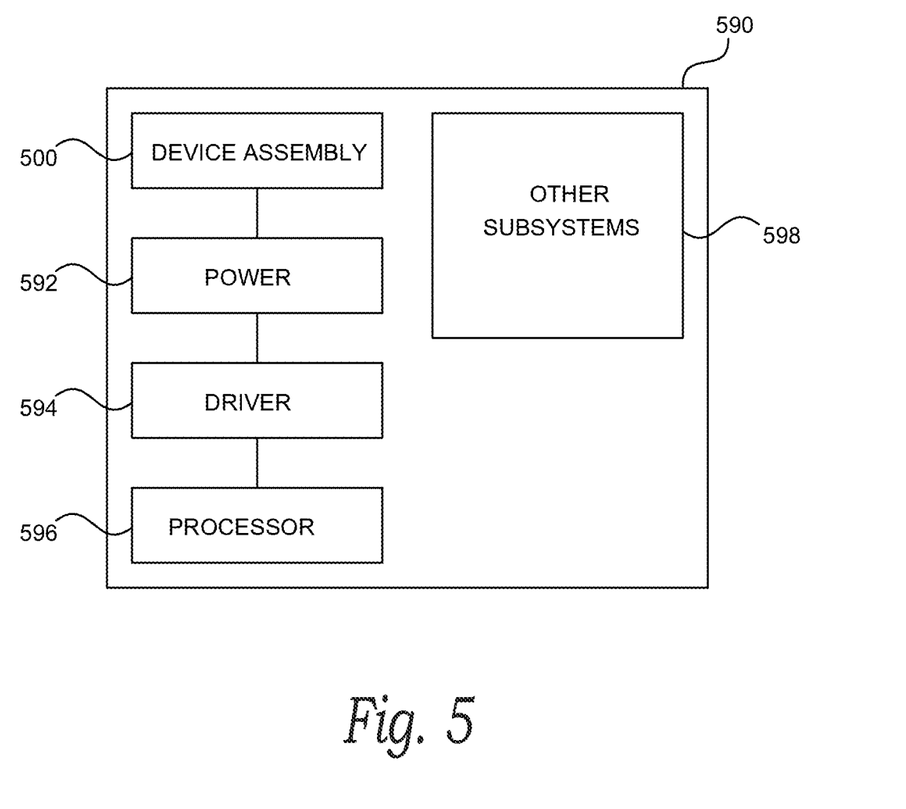
FIG. 5 is a schematic view of a system that includes a memory device configured in accordance with various embodiments of the present technology.

FIG. 5 is a schematic view of a system that includes a memory device configured in accordance with various embodiments of the present technology. Any one of the foregoing memory systems, devices, and/or dies described above with reference to FIGS. 1-4B can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory systems, devices, and/or dies described above with reference to FIGS. 1-4B, and can, therefore, include various features of programmable die refresh stagger. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded. As used herein, the phrase "and/or" as in "A and/or B" refers to A alone, B alone, and both A and B.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory system, comprising:
    a plurality of memory devices, each of the plurality of memory devices including a command/address input circuit separate from command/address input circuits of other memory devices of the plurality of memory devices, each of the plurality of memory devices belonging to a corresponding one of a plurality of groups, each group associated with a different time delay for initiating refresh operations for memory devices of the group,
    wherein at least one memory device of the plurality of memory devices is configured to:
        detect the group of the plurality of groups to which the at least one memory device belongs; and
        after receiving a command to initiate a refresh operation, delay initiating the refresh operation by a time delay corresponding to the detected group.

2. The memory system of claim 1, wherein the at least one memory device includes a fuse array storing information, wherein the information specifies the group of the at least one memory device, and wherein the at least one memory device is configured to detect the group to which the at least one memory device belongs by reading the information from the fuse array.

3. The memory system of claim 1, wherein the at least one memory device of the plurality of memory devices includes a terminal and circuitry electrically connected to the terminal, and wherein the circuitry is configured to detect the group to which the at least one memory device belongs.

4. The memory system of claim 3, wherein, to detect the group to which the at least one memory device belongs, the circuitry is configured to determine whether the terminal is connected to a first polarity or a second polarity.

5. The memory system of claim 3, wherein, to detect the group to which the at least one memory device belongs, the circuitry is configured to determine a voltage level supplied to the terminal of the at least one memory device.

6. The memory system of claim 5, further comprising at least one resistor electrically connected to the terminal of the at least one memory device, wherein the at least one resistor is configured to affect a voltage level supplied to the terminal of the at least one memory device.

7. The memory system of claim 1, wherein the group to which the at least one memory device belongs is either a first group or a second group, and wherein the time delay corresponding to the first group or the second group is greater than zero seconds (0s).

8. The memory system of claim 1, wherein:
    the group of the at least one memory device is a first group, a second group, or a third group; and
    the time delays corresponding to the first, second, and third groups stagger initialization of refresh operations of the first, second, and third groups by a uniform amount of time.

9. The memory system of claim 1, wherein the at least one memory device includes two or more memory dies, and wherein at least one of the two or more memory dies includes (a) a fuse array storing information that specifies the group to which the at least one memory device belongs, (b) a terminal and circuitry electrically connected to the terminal, or (c) both.

10. The memory system of claim 1, wherein the at least one memory device is an individual memory die.

11. A method, comprising:
    receiving a command to initiate a refresh operation at a memory device that is one of a plurality of memory devices, wherein each memory device of the plurality of memory devices includes a command/address input circuit separate from command/address input circuits of other memory devices of the plurality of memory devices;
    detecting a group of the memory device, wherein the group comprises a subset of memory devices of the plurality of memory devices; and
    initiating the refresh operation of the memory device based at least in part on a time delay corresponding to the detected group.

12. The method of claim 11, wherein detecting the group of the memory device includes reading information from a fuse array having antifuse elements corresponding to the memory device, wherein the information specifies the group of the memory device.

13. The method of claim 11, wherein detecting the group of the memory device includes determining whether a terminal of the memory device is connected to a first polarity or a second polarity by driving the terminal of the memory device high, by driving the terminal of the memory device low, or both.

14. The method of claim 11, wherein detecting the group of the memory device includes determining a voltage level supplied to a terminal of the memory device.

15. The method of claim 11, wherein:
the memory device includes a first memory die and a second memory die;
detecting the group of the memory device includes detecting a first group of the first memory die and detecting a second group of the second memory die;
initiating the refresh operation of the memory device includes—
  initiating a first refresh operation of the first memory die based at least in part on a first time delay corresponding to the detected first group, and
  initiating a second refresh operation of the second memory die based at least in part on a second time delay corresponding to the detected second group; and
  the first time delay is different than the second time delay.

16. A memory device, comprising:
a first memory die and a second memory die; and
(i) a fuse array and/or (ii) a terminal associated with a refresh operation of the memory device, and circuitry operably coupled to the terminal,
wherein the memory device is configured to—
  detect a first group of a plurality of groups to which the first memory die belongs;
  detect a second group of the plurality of groups to which the second memory die belongs;
  after receiving a command to initiate the refresh operation, delay initiating the refresh operation on the first memory die by a first time delay corresponding to the first group and delay initiating the refresh operation on the second memory die by a second time delay corresponding to the second group; and
  the first time delay is different from the second time delay.

17. The memory device of claim 16, wherein:
the memory device includes the fuse array;
to detect the group to which the memory device belongs, the memory device is configured to read information stored in the fuse array; and
the information specifies the first group and/or the second group.

18. The memory device of claim 16, wherein:
the memory device includes the terminal and the circuitry; and
to detect the first group and/or the second group to which the memory device belongs, the circuitry is configured to—
  determine whether the terminal is tied to a first polarity or a second polarity, and/or
  determine a voltage level supplied to the terminal.

19. The memory device of claim 16, wherein the first memory die includes (a) the fuse array storing information that specifies the group, (b) the terminal and the circuitry, or (c) a combination thereof.

20. The memory device of claim 16, wherein the first group is different from the second group.

* * * * *